United States Patent [19]

Collins et al.

[11] 4,156,818

[45] May 29, 1979

[54] OPERATING CIRCUITRY FOR SEMICONDUCTOR CHARGE COUPLED DEVICES

[75] Inventors: Thomas W. Collins, Saratoga; Karl R. Hense, Los Altos, both of Calif.

[73] Assignee: International Business Machines Corporation, Armonk, N.Y.

[21] Appl. No.: 643,999

[22] Filed: Dec. 23, 1975

[51] Int. Cl.² .................. G11C 19/28; H01L 29/78; H03K 5/20; H03H 7/28
[52] U.S. Cl. ........................ 307/221 D; 307/353; 307/DIG. 3; 357/24; 333/165
[58] Field of Search ............ 357/24; 307/221 D, 304, 307/297; 333/70 T

[56] References Cited

U.S. PATENT DOCUMENTS

| 3,623,132 | 11/1971 | Green | 357/24 |
| 3,700,932 | 10/1972 | Khang | 357/24 |
| 3,758,794 | 9/1973 | Kosonocky | 357/24 |
| 3,781,574 | 12/1973 | White et al. | 357/24 |
| 3,809,923 | 5/1974 | Esser | 307/221 D |
| 3,934,161 | 1/1976 | Caywood | 357/24 |
| 3,969,636 | 7/1976 | Baertsch et al. | 357/24 |
| 3,997,973 | 12/1976 | Buss | 357/24 |
| 4,004,157 | 1/1977 | Baertsch et al. | 307/221 D |
| 4,048,525 | 9/1977 | Goldberg et al. | 357/24 |

OTHER PUBLICATIONS

MacLennan et al., "Novel Technique for the Linearisation of Charge Coupled Devices", Electronics Letters, vol. 11 (5/75) pp. 222-223.
Sequin et al., "Linearity of Electrical Charge Injection into Charge Coupled Devices", IEEE J. Solid-State Circuits, vol. 50-10 (4/75) pp. 81-92.
MacLennan et al., "Technique for Realising Transversal Filters Using Charge Coupled Devices", Proc. IEE (GB), vol. 122 (6/75) pp. 615-619.
Weste et al., "Charge-Coupled Device Digital-Analogue Convertor", Electronics Letters, vol. 11 (10/75) pp. 551-552.
Altman "The New Concept for Memory and Imaging : Charge Coupling", Electronics (6/21/71) pp. 50-59.
Ibrahim et al., "CCD's for Transversal Filter Applications", IEEE Int. Electron Devices Meeting, Tech. Dig. (12/08/74) pp. 240-243.
Tobey et al., Eds., *Operational Amplifiers : Design and Applications*, McGraw-Hill, N.Y. (1971) pp. 212-213.

*Primary Examiner*—William D. Larkins
*Assistant Examiner*—Gene M. Munson
*Attorney, Agent, or Firm*—George E. Roush

[57] ABSTRACT

Operating circuitry for linear charge launching, non-destructive weighting and non-destructive charge sensing for Charge Coupled Devices (CCD) employs electronic integrating circuitry at the input and output node terminals of the CCD. Feedback circuitry within the integrating circuitry aids in linearizing the signals, in eliminating the non-linear capacitance effect of the depletion regions, and in freeing the design from device parameter variations such as electrode area and absolute values of threshold potential and thickness of insulating layer. The circuitry is adaptable to most conventional CCD and is readily made up of conventional resistance and capacitance elements, of conventional comparing circuits such as differential amplifying or signal repeating circuits, and of conventional summing circuitry.

16 Claims, 11 Drawing Figures

OPERATING CIRCUITRY FOR SEMICONDUCTOR CHARGE COUPLED DEVICES

The invention is directed to operating circuitry for Charge Coupled Devices (CCD), and it particularly pertains to integrating mode circuitry for assuring accurate, linear signal processing despite certain device parameter variations from manufacturing process tolerances.

The basic concept of charge coupled semiconductor devices was described by Willard Sterling Boyle and George Elwood Smith in an article published in the Bell System Technical Journal, page 587 for Apr. 19, 1970, entitled "Charge Coupled Semiconductor Devices." As described by Boyle and Smith, a charge coupled device consists of a metal-insulation-semiconductor (MIS) structure in which minority carriers are stored in a "spatially defined depletion region," also called a "potential well" at the surface of the semiconductor material. The charge is moved along the surface by moving the potential minimum. A paper on page 593 of the same volume of the Bell System Technical Journal by Amelio et al, entitled "Experimental Verification of the Charge Coupled Device Concept" describes experiments carried out to demonstrate the now widely accepted feasibility of the charge coupled device concept.

More generally, the charge coupled device comprises a charge storage medium, and an array of metal electrodes disposed upon the insulator. Information is introduced in the medium in the form of mobile charge carriers. These charge carriers may be moved through the medium in a direction essentially parallel to the surface of the medium by successively biasing a series of electrodes. Usually, the storage medium is a semiconductor, the charge carriers are minority carriers, and the transfer mechanism is characterized by the creation of depletion regions of varying depths into which the minority carriers "spill". However, the storage medium may also comprise a semi-insulating material wherein the charge carriers are carriers as described and claimed in U.S. Pat. No. 3,700,932 issued on Oct. 24, 1972 to Dawon Kahng for "Charge Coupled Devices."

While there is much information available on CCD at the present, the main thrust to date has been on the CCD in and of themselves and therefore the operating circuitry principally has not been given the necessary development required for optimum operation of the more important applications of the proposed CCD. For given CCD, the key problems encountered are the accuracy, linearity and the variations in device parameters brought about with the tolerances possible in present day manufacturing processes. The invention stems from studies of CCD transversal filters and like signal processing systems. Prior art arrangements directed to systems having aspects in common are to be found in the following U.S. Patents:

| 3,623,132 | 11/1971 | Green | 307/205 |
|---|---|---|---|
| 3,700,932 | 10/1972 | Kahng | 307/304 |
| 3,758,794 | 9/1973 | Kosonocky | 307/304 |
| 3,781,574 | 12/1973 | White et al | 307/304 |

The patent to Green is directed to a circuit arrangement for binary logically sensing the charge in a CCD array using simple direct input circuitry by comparing a reference voltage stored in a reference store capacitor with the voltage stored in operation of the CCD in a portion having an effective capacitor therein. This effective capacitor is subject to device parameter variations, and while this capacitor is effective in most, if not all, CCD circuitry the defect therewith is obviated by the circuitry according to the invention.

The patent to Khang, which provides a basic review of the CCD, is directed to CCD structure wherein, among other things, the storage media are more specifically capacitive than in earlier structures and the dielectric thereof is especially controlled. This definitely betters the charge transfer efficiency over that of earlier structures, but it does not obviate the problem, as is the case with the circuitry of the invention.

The patent to Kosonocky, which also provides much general CCD theory, is directed to CCD structure and includes operating circuitry of interest, particularly in the use of a differential signal detector, as shown therein. The effect of device parameter variations is substantially reduced according to the teaching of Kosonocky in that a binary logic signal is propagated in one CCD shift register while the complement of the signal is propagated in another and a differential detector senses the binary values. With the proper polarities of binary signals applied and ideally identical CCD's, the effect of certain parameters are nullified, but in the practical case the effects are only reduced and the ability to translate analog signals is absent.

The patent to White et al, which contains an analysis of the above-mentioned circuit of Green, is directed to a coherent readout circuit for a CCD array. The circuit is complete on a single substrate, but it is readily separated by analysis. Essentially the readout circuitry of the disclosure of Green is improved by a Metal-Insulation-Semiconductor (MIS) multiplexing switch formed in the CCD in conjunction with a reverse biased charge collecting diode in addition to the usual reset switch and sample-and-hold circuitry for comparing the charges stored in the capacitors, all arranged in a manner as to supress switching transients and "Nyquist" noise voltage associated therewith. The switching circuitry differs from that of the invention as will be brought out hereinafter but is still subject to the device parameter variation which is obviated by the sensing circuitry according to the invention.

The objects referred to hereinbefore and those that will appear hereinafter as the specification pogresses obtain in CCD operating circuitry functioning in an integrating mode with feedback referencing for linearizing the charge launching and the sensing of the charge as propagated through the CCD.

In accordance with the invention, linear signal launching subcircuitry comprises electric energy comparing circuitry in the form of an operational amplifier, a differential amplifier or a repeating circuit having an input terminal electrically connected to the substrate of the CCD, another input terminal electrically connected to an input diffusion diode element of the CCD and an output terminal connected to an input gating electrode of the CCD, the input signal is then applied between the substrate of the CCD and a resistance element electrically connected to the input terminal of the repeating circuit which is connected to the input diffusion diode element. The resistance element is given a value at which the rate of charge launched is the linear interval with respect to time of the value of the input signal voltage divided by the value of the resistance element. In an alternate embodiment of a charge launching subcircuitry according to the invention, a comparing circuit in the form of an operational amplifier or a differential amplifier or a repeating circuit has an output terminal connected to the input gating electrode and the input signal is applied between one input terminal of the repeating circuit and a common connection to the input diffusion diode element, and the substrate. A charge sensing circuit is connected between the sense electrode of the CCD and the other input terminal of the repeating circuit for maintaining the charge launching integrally linear with respect to time.

Integrating charge sensing subcircuitry according to the invention comprises a differential repeating circuit having one input terminal electrically connected to a sense gating electrode of the CCD, another input terminal connected to a source of fixed reference potential and an output terminal at which an output voltage is delivered, and a capacitor connected between the output terminal of the repeating circuit and the input terminal of the repeating circuit which is connected to the sense gating electrode. The capacitor is given a value at which the output voltage of the sensing subcircuitry is the linear intergral with respect to time of the sensing current multiplied by the reciprocal of the value of the capacitor. The integrating circuit thus formed by the differential repeating circuit and the capacitor is reset simply by applying a resetting pulse to the capacitor by way of a series diode and resistor circuit for bringing the charge in the capacitor to an initial operating state or by simply discharging the capacitor through conventional transistor discharge circuitry.

Further according to the invention, the output signals obtained from stage to stage as propagated within the CCD are weighted by split conductance circuitry. One embodiment of weighting subcircuitry comprises one resistance element connected between the sense gating electrode of the CCD and one input terminal of the repeating circuit. Another resistance element is connected between the sense electrode and the other input terminal of the repeating circuit. The resistance elements are given values at which a predetermined weighting factor is equal to the value of one of the resistance elements divided by the sum of the values of both resistance elements. With this weighting circuit arrangement, the dynamic range is limited to the ratio of the two resistance elements. For large dynamic ranges, large resistance ratios are required. This disadvantage is avoided by using positive and negative charge detectors connected to an algebraic summing circuit and connecting the input circuits of the charge detectors to opposite ends of the sense gating electrode by means of individual resistance elements whereby the weighting factor is the ratio of the difference value of the resistance elements divided by the sum of the value of the resistance elements. Since the weighting coefficient is then primarily determined by the difference of the two resistance elements, a large dynamic range is possible without large resistance ratios.

In order that all of the advantages of the invention fully obtain, preferred embodiments are described hereinafter, by way of example only, with reference to the accompanying drawing, forming a part of the specification and in which.

Figure 1:
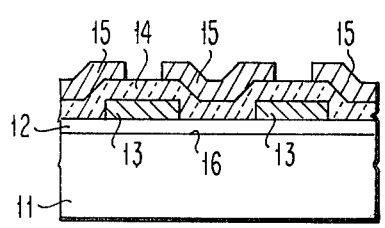
FIGS. 1, 2 and 3 are schematic diagrams of three different CCD devices to which the circuitry according to the invention is applicable.

The operating circuitry according to the invention is useful with all, or nearly all, types of CCD. Three examples of conventional CCD are shown schematically in FIGS. 1-3 and are discussed briefly below to provide an understanding of the devices with which the operating circuit according to the invention operates. FIG. 1 illustrates but one example of a "surface channel" CCD. An n-silicon substrate 11 has a layer 12 of some insulating material uniformly laid down over it. Conductive strips of doped polysilicon 13 are laid over the layer 12. An oxide layer 14 is laid over the whole structure at this point. Conductive strips 15 are then arranged over the layer 14. In this type of CCD, a minority charge is propagated near the silicon/silicon-dioxide interface 16. This charge is called a minority charge. If the substrate is made from a p-type material, minority charges are electrons, or n-type, if the substrate is made from an n-type material the minority charges are "holes" or p-type. The charges are transferred from one well to the next by manipulating voltages on the electrodes, such as the strips 13 and 15 on the surface. One problem with the simple CCD is that some of the charge is trapped near the interface 16 due to fast surface states and the high speed transfer efficiency of the device is reduced.

Figure 2:
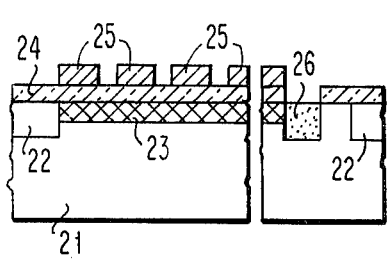

FIG. 2 schematically illustrates a "buried-channel" CCD that overcomes some of this problem. A p-silicon substrate 21 has n-type material diffused therein to provide channel stops 22. An implanted n-layer 23 is laid down to form the "buried-channel". The conventional insulating oxide layer 24 and the conventional metallic aluminum strips 25 form the gating, sensing, and like electrodes. An n-type diffusion forms an output diode 26. Such an output diode is arranged in many CCD. The buried-channel CCD attempts to overcome the loss of high speed charge transfer efficiency at the interface by means of the implanted layer 23, which layer is of the same type as the minority carriers in the silicon substrate 21. When the silicon substrate is p-type, the implant is n-type, and the converse. The implant layer 23 is lightly doped and the minority carriers are positioned about mid-way through that region. Thus, the charge well has been transferred away from the silicon/silicon-dioxide interface and the losses are reduced.

Figure 3:
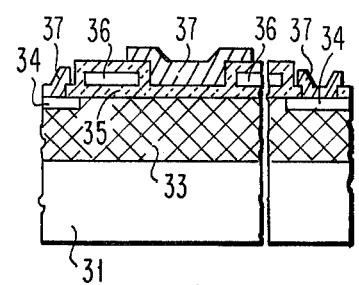

FIG. 3 schematically illustrates a "peristaltic" CCD which has a p-silicon substrate 31 over which an n-type epitaxial layer 33 is laid. The diffusions 34 of p+ material are arranged to isolate a certain region of the epitaxial layer 33 so that an n-type pocket is formed. Silicon-oxide 35 is laid over the epitaxial layer 33 and doped polysilicon strips 36 are embedded in the oxide layer. Aluminum strips 37 form the electrodes as with the other CCD. n+ source and drain regions are formed at opposite ends of the n-type pocket and an electrode 37 is put between the source and the drain, just as in other conventional CCD. When an electrode is pulsed negatively, electrons that are already in the region are forced out, so that there is nothing but immobile space charge in the device. Electrons are introduced from the source when information is entered. Instead of going up to the surface, the electrons go only mid-way in the epitaxial layer and thus they are positioned in a potential well that is away from the surface. The basic concept of this CCD is different from the "buried-channel" type; there are no minority carriers moving in the buried-channel. These carriers are injected from the source and are trapped by space-charge regions on all sides.

These CCD's are but three distinctly differing examples of CCD devices with which circuitry according to the invention may be used and it should clearly be understood that many variations of these and other different CCD may be operated by circuitry designed according to the teaching herein. Embodiments of the operating circuitry depicted in FIG. 4 and according to the invention are described hereinafter in conjunction with an exemplary CCD 40 comprising a charge storage medium having a substrate 41, p-n diode junction elements 42 and 43, an insulating layer 44 covering the charge storage medium and a multiple of discrete field plate electrodes 45. A description of the operation of the field plate electrodes 45 in establishing storage sites within the charge storage medium 41 is found in U.S. Pat. No. 3,654,499 to George Edward Smith of the Bell Telephone Laboratories. A charge launching site in the storage medium 41 is denoted by the diode element 42 and the first plate electrode 45i which serves as an input gating electrode. In effect, the first stage of the CCD 40 is analogous to a Metal Oxide Semiconductor Field Effect Transistor (MOSFET) wherein the electrode 45i corresponds to the FET gate electrode, the p-type material 42 corresponds to the FET source electrode and the transfer and sensing plates electrodes virtually correspond to the drain electrode. In the exemplary CCD 40 as shown having an n-silicon substrate 41, +p-type diffusion areas are aranged as and where desired, as for example, as an input diode element 42 for the charge launching site and as an output diode element 43 for a charge delivery site. The layer 44 of silicon dioxide, for example, is deposited uniformly upon the substrate 41 and the desired number of conductive gating electrodes 45 are laid down upon the layer 44. The substrate 41 alternately is of p-type silicon in which case the diffusion elements are n-type material and so on as is well known in the fabrication of semi-conductor devices. Those skilled in the art will understand the operating circuitry to be described hereinafter with respect to this exemplary type of CCD and will readily apply the teachings to the particular type of CCD at hand.

An embodiment of the subcircuitry for launching the charge into a CCD is shown connected to the input gating plate electrode 45i. A source of signal, represented here by the symbol of a generator 50, is connected to input terminals 51 and 52. The input terminal 51 is connected to one terminal of a resistance element 54. The other terminal of the resistor is connected in common to the input diode 42 and one terminal of a differential amplifying or repeating circuit 56 serving here as a comparator circuit. The other input terminal of the repeating circuit 56 is connected in common to the other signal input terminal 52 and the substrate 41 of the CCD. The output terminal of the signal repeating circuit 56 is connected to the input gating electrode 45i. This subcircuitry requires a minimum amount of circuitry for launching a charge linearly into the CCD 40. The essential circuit components required comprise a low input bias current differential amplifying or repeating circuit 56 and one resistance element 54.

The CCD is especially applicable to digital data translation, although analog data translation is contemplated with the circuitry according to the invention. The generator 50 is depicted as an analog signal generator; a source of digital signal is readily substituted therefor. A "chopped analog" signal is conventionally used with circuitry according to the invention. Further, according to the invention, the desired effect obtains with the addition of a diode 57 connected from the output terminal to the input terminal of the comparator circuit 56 and another diode 58 and a resistor connected in series to a terminal 61 at which a positive going enabling pulse wave is applied for sampling the signal wave from the generator 50.

This charge launching circuit arrangement functions in a manner similar to that of a current regulator and produces a constant current at the input circuit of the CCD. The operation can be explained in the following manner. The presence of a positive signal voltage $V_{in}$ causes the output of the amplifier to swing negatively and this applies a negative voltage to the input gate 45i of the CCD 40. This, in turn, causes the input MOSFET to turn on and allows a current to flow through the effective MOSFET and into the first stage of the CCD 40.

The amplifier has a negative feedback path through the CCD input FET and is therefore self-regulating. The current launched into the CCD is proportional to the input signal $V_{in}$ and can be expressed as $$i_{launched} = V_{in}/R. \qquad (1)$$

The charge launched into the CCD is equal to the integral of the launching current with respect to time $$Q_{launched} = \int_0^t V_{in}/R \, dt. \qquad (2)$$

The magnitude of the current launched is very small, typically being in the order of nanoamperes. Care is taken to insure that all of the current entering the CCD 40 at the input diode 42 flows into the first stage without loss. A particular problem otherwise occurs at the input where the p+ diffusion forms a diode junction with the substrate 41. If there is any bias voltage present across this junction, a current will flow between the input diffusion and the substrate. This current will add to, or subtract from, the current being launched into the CCD, thereby causing an error in the launching. A feature of this circuit arrangement according to the invention is that leakage current is eliminated from the input diode 42 by forcing the input diffusion voltage to be equal to the substrate voltage $V_{sub}$. This keeps the differential voltage across the diode junction equal to 0. If there is no voltage difference across the diode junction, then there can be no current flow through that diode and the leakage current is thus eliminated.

Figure 5:
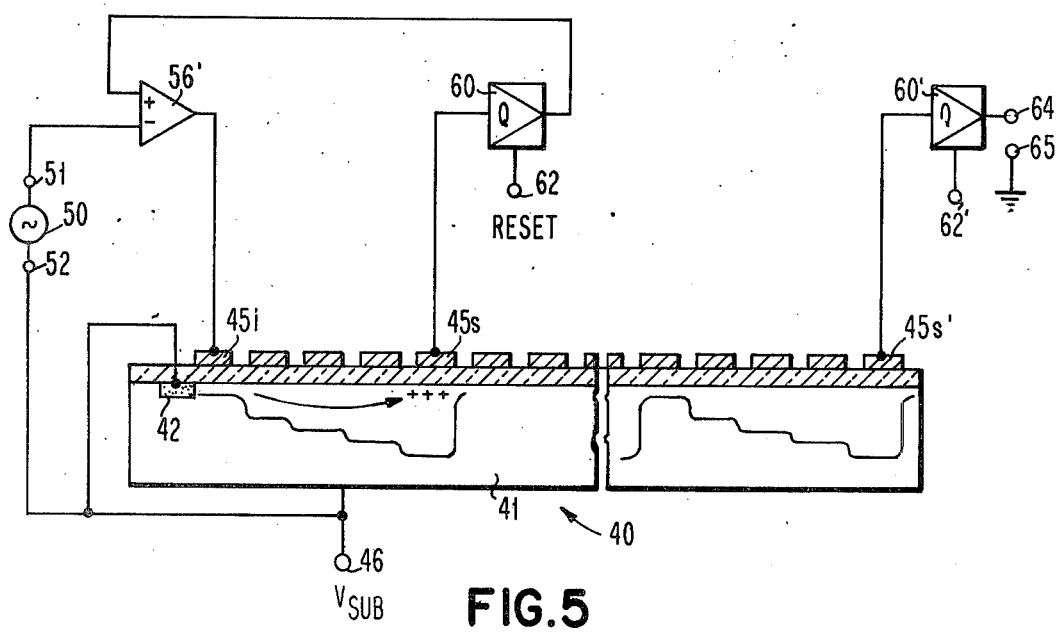
FIG. 5 is a similar schematic diagram illustrating an integrating measured charge launching subcircuitry according to the invention with circuitry illustrating an arrangement for eliminating the charge distribution problem and the nonlinear effects of depletion region capacitance according to the invention.

Another embodiment of a charge launching subcircuitry according to the invention is shown in FIG. 5. Here the source signal generator 50 is connected to signal input terminals 51 and 52, the latter of which is connected to the substrate 41 as before, but here the input diode element 42 is connected to the signal input terminal 52 and the other signal input terminal 51 is connected one terminal of the signal repeating circuit 56'. The output of the signal repeating circuit 56' is connected to the input gating electrode 45i as before. The other input terminal of the differential signal repeating circuit 56' is connected to charge detecting subcircuitry 60 at the output terminal thereof. The input terminal of the charge detecting subcircuitry 60 is connected to the sense electrode 45s. The charge sensing subcircuitry 60 is resettable and has a reset pulse input terminal 62. Further details of charge sensing subcircuitry 60 according to the invention are given hereinafter. A charge is launched linearly into the CCD with these essential components operating in a "measured charge mode". The charge detecting subcircuitry 60 senses the amount of charge launched into the first stage of the CCD 40 and the signal repeating circuitry 56' serves as a comparator circuit which controls the FET input of the CCD. Initially, the first stage of the CCD 40 is empty and the FET at the input is turned off. The charge detector 60 is normally momentarily reset and ready to measure a new charge. The application of signal voltage at the input terminals 51,52 will cause the comparator or repeating circuit 56 to switch the input FET on and start current flowing into the CCD 40. The corresponding charge will then accumulate in the first stage of the CCD. The charge detecting subcircuitry 60 senses and tracks this charge as the first stage of the CCD fills up. The output voltage from the charge detecting subcircuitry 60 is compared to the input signal voltage at the input of the differential repeating circuit 56'. When the charge measured and the input signal voltage are equal, the comparing repeating circuit 56' will switch the virtual input FET off and thus terminate the current flow into the first stage. At the end of this sequence, the measured signal charge in the first stage is proportional to the magnitude of the input signal from the generator 50.

Figure 4:
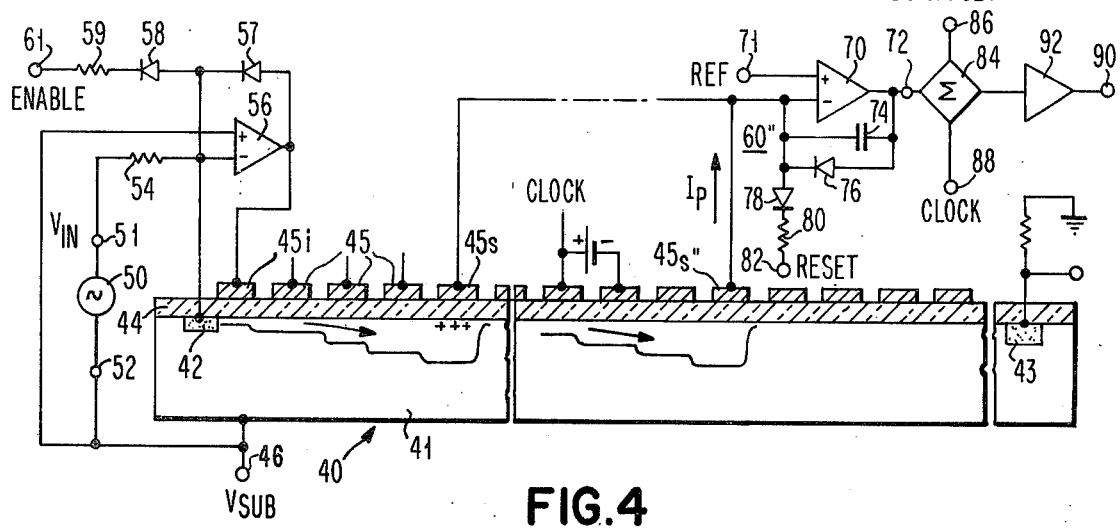
FIG. 4 is a schematic diagram of an exemplary CCD and integrating linear current charge launching subcircuitry and non-destructive charge sensing subcircuitry according to the invention.

There is an important difference between the operation of the linear current of FIG. 4 and the measured charge method of FIG. 5. In the linear current method, it is the free electronic charge launched into the CCD that is proportional to the input signal; whereas in the measured charge method, it is the amount of signal charge measured in the first stage that is proportional to the input signal. In the linear current method, linearity is assured by launching current linearly and by eliminating nonlinear leakage current. In the measured charge method, it does not matter if the input current is nonlinear or if leakage currents are present because the subcircuitry only detects the measurable amount of signal charge. A more exact analysis of the difference is given hereinafter in connection with the sensing subcircuitry.

The measured charge method of launching may be utilized in a CCD application to completely eliminate the nonlinear effects of depletion region capacitance and the nonlinear effect of charge distribution in buried channel on peristaltic CCD. Such an arrangement, which is truly linear, is shown in FIG. 5. Additional charge sensing subcircuitry 60' is connected to another sense gating electrode 45s'. A reset terminal 62' is connected as before and the measured charge is delivered at output terminals 64,65. There are four main attributes of the system. A measured charge launcher is connected to the input end of the CCD to launch the charge into the CCD. Nondestructive sensing is used at the output to detect the charge in the CCD. The same type of charge detector is used in both the input and output circuits and the electrical input characteristics of the two are identical. The input and output stages of the CCD are physically and electrically identical.

The input circuitry launches the amount of charge that is required to make the measured signal charge in the first stage proportional to the input signal voltage. When the free electronic charge is propagated to the output stage, the same amount of signal charge is detected by the output charge detector subcircuit because of the identical characteristics of the input and output stages. It does not matter how much charge is stored in the depletion region capacitance element or if leakage occurs at the input diode or how the charge is distributed within the storage medium because the input and output circuits are strictly functions of the measurable signal charge.

The concepts of measured charge launching are deemed to be applicable especially to the nonlinear charge distribution problems encountered in buried channel devices.

Linearity and maximum sampling rates achievable for this system are limited by the overall response time of the charge detector and electric energy comparator circuits. The accuracy is a function of the output voltage of the charge detector and the resolution of the comparator.

Returning to FIG. 4, charge sensing subcircuitry 60'' is connected to a sensing gating electrode 45s''. A comparator circuit in the form of a differential amplifying or signal repeating circuit 70 has one input terminal connected to the sense gating electrode 45s'' and the other input terminal connected to a point of fixed reference potential at a terminal 71. The output of the repeating circuit 70 is connected to an output terminal 72 and to a terminal of a capacitor 74, the other terminal of which is connected to the first input terminal of the repeating circuit 70. An integrating circuit is thus formed. A semiconductor device, shown here as a diode 76 is shunted across the capacitor 74 for connecting the capacitor 74 to a terminal 82 at which negative-going reset pulses are applied for periodically discharging the capacitor 74. Preferably a mixing circuit 84 is connected to the output terminal 72 for applying dc offset potential at input terminals 86 and the clock driver voltage at terminal 88 for eliminating the offset potential and the effect of clock voltage feedthrough at the output terminal 90. Preferably, an amplifying circuit 92 is interposed between the mixing circuit and the output terminal 90, both for isolation and for amplification of the voltage appearing at the terminal 72. Non-destructive sensing of the charge contained in the CCD 40 is afforded by this basic circuit, which consists of a gated integrator followed by a summing amplifier which provides dc level shifting and cancellation of the clock voltage feedthrough. The choice of integrator components are consistent with low-current design criteria. In particular, the repeating circuit 70 has a low input bias current and high gain, and the diodes 76,78 have low reverse current characteristics. The integrator is initialized between read cycles by applying a reset pulse signal to the terminal 82 which clamps the output at the terminal 72 to a predetermined voltage. This eliminates the long time drift error associated with the integrator.

The integrator output voltage $V_{Qdet}$ is proportional to the integral with respect to time of the sense plate displacement current $i_p$ and can be expressed as $$V_{Qdet} = 1/C \int_0^t i_p dt. \tag{3}$$

The sense displacement current $i_p$ is a nonlinear function of the free electronic charge $\delta Q_n$. In the semiconductor, there are two charges: (1) the "free electronic charge" $Q_n$ which is propagated through the CCD, and (2) the "bulk charge" $Q_b$ which resides in the depletion region. The presence of these two charges causes a corresponding "signal charge" $Q_s$ to accumulate outside the semiconductor on the sense plate of the CCD. A differential charge balance equation is:

$$|\delta Q_s| = |\delta Q_n| = |\delta Q_b|. \tag{4}$$

It follows that the displacement current $i_p$ is a linear function of $\delta Q_s$. However, $i_p$ is not a linear function of the free electronic charge $\delta Q_n$ due to the fact that $\delta Q_b$ is related to the depletion region capacitance and is, in part, a nonlinear function of $\delta Q_n$. The nonlinearity between $i_p$ and $\delta Q_n$ is reduced to an acceptable level for many applications by (1) using a high resistivity substrate, (2) keeping the sense plate voltage constant, and (3) restricting the range of $\delta Q_n$.

This circuit maintains the dc voltage on the sense plate electrode at a constant value. Momentary transients do occur and are tolerated during charge integration but the voltage at the sense plate electrode always returns to the reference voltage $V_{ref}$ when the signal is fully integrated. This eliminates one of the nonlinear depletion region capacitance effects that would otherwise occur if the sense plate voltage were allowed to change during charge sensing.

Sense plate displacement current is always properly integrated (no charge is lost) even if the response time of the repeating circuit 70 is longer than the duration of the displacement current being integrated. This allows a large freedom in amplifier design. The circuit is insensitive to the amount of stray capacitance present on the sense line, the area of the sense electrode, and also the absolute values of threshold voltage and oxide thickness.

The three main sources of error in this detector circuit are (1) variations in clock feedthrough, (2) stray leakage currents on the sense line, and (3) uncorrelated noise.

The clock feedthrough is expressed as $$Q_{clock} = f_{v1}^{v2} C_{interelectrode\ capacitance} dV_{clock}. \tag{5}$$

Interelectrode capacitance is constant for a given device but the clock voltage amplitude usually has some variation associated with it. The effect of clock feedthrough and its variation due to changes in clock voltage can be eliminated by subtracting the clock voltage at the input node of the summing amplifier as shown in FIG. 4.

Leakage charge due to stray leakage currents may be expressed as $$Q_{leakage} = \int_0^t i_{leakage} dt. \tag{6}$$

The leakage current is very low in good CCD and is usually a negligible factor here since it only contributes to error during the integration period.

Uncorrelated noise sources are (1) the "device noise" (due to theoretical charge uncertainty in the CCD) associated with the interelectrode capacitance between the clock and sense plates, (2) the reset "device noise" associated with the integrated feedback capacitor, and (3) coupled noise from adjacent digital circuitry. The device noise (or "Katysee") effects are proportional to $$(KTC)^{\frac{1}{2}}$$

where K is the Boltzman constant,
T is the temperature in ° K. and
C is the capacitance in farads.

The largest noise present is the reset noise because it has the largest capacitance component. The integrator capacitor used in one application had a value of 24 picofarads, and the charge undertainty resulting from this capacitance is 316 attocoulombs. Typical CCD bucket capacities are in the order of picocoulombs. The interelectrode noise is reduced by decreasing this capacitance, but the practical dynamic range is eventually limited by this noise.

Coupled noise from adjacent digital circuitry can add an appreciable amount of charge uncertainty. This noise is reduced by proper shielding, isolation, and decoupling of power supplies.

This charge sensing subcircuitry is contemplated for use in lieu of the Differential Current Integrator (DCI) to implement a transversal filter using the split electrode weighting technique described by Dennis D. Buss and others of Texas Instruments. This arrangement eliminates chargehogging effects that develop during sensing due to a differential voltage across the positive and negative sense busses. It also eliminates the nonlinear effect of depletion region capacitance due to voltage changes on the sense plate that occur during sensing when the DCI method is used.

The charge detector 60" lends itself very well to a novel method of weighting using a split conductance channel to proportionately distribute the sense plate displacement current.

Figure 6:
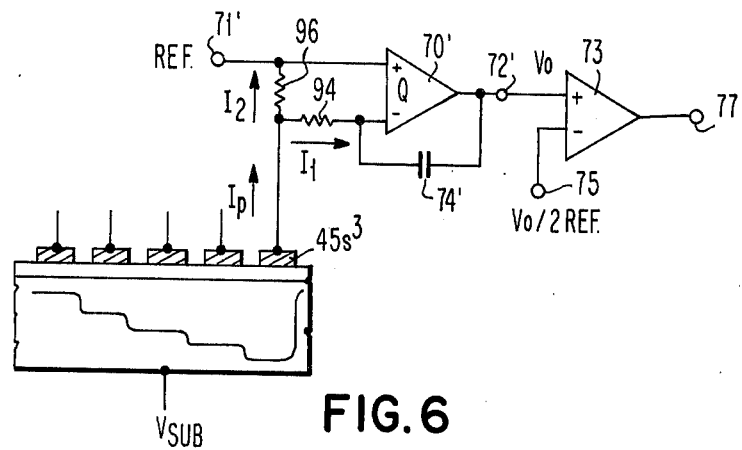
FIGS. 6, 7 and 8 are schematic diagrams of subcircuitry for weighting the charge sensed at predetermined electrodes of the CCD according to the invention.

FIG. 6 illustrates a split conductance weighting concept according to the invention as applied to a single CCD stage. The weighting network as shown consists of resistance elements 94 and 96. This network is placed in the signal path between the CCD sense plate and charge detector $Q_{det}$ as shown. The signal current $i_p$ is divided in the network and only part of the current $i_1$ is available to go to the input of the charge detector. The weighting factor depends on the resistance values of the resistance elements 94 and 96. This factor is $$R_{96}/R_{94} + R_{96} \tag{7}$$

The output voltage of the charge detector is $$V_{out} = -1/C\ R_{96}/(R_{94} + R_{96}) \int_0^t i_p dt. \tag{8}$$

Both positive and negative coefficients are possible, including the arrangement wherein the coefficient is of one polarity and the value swings above and below a predetermined reference level, but the reduced range of value must be tolerated. A large number of sense plates can be individually weighted and also summed by adding a split conductance network to each plate and connecting the network outputs to common busses.

This circuit has the disadvantage of the dynamic range being limited to the ratio of the two resistance elements. To achieve large dynamic ranges, large resistance ratios are required, which is difficult to achieve using standard integrated circuit manufacturing processes.

Figure 7:
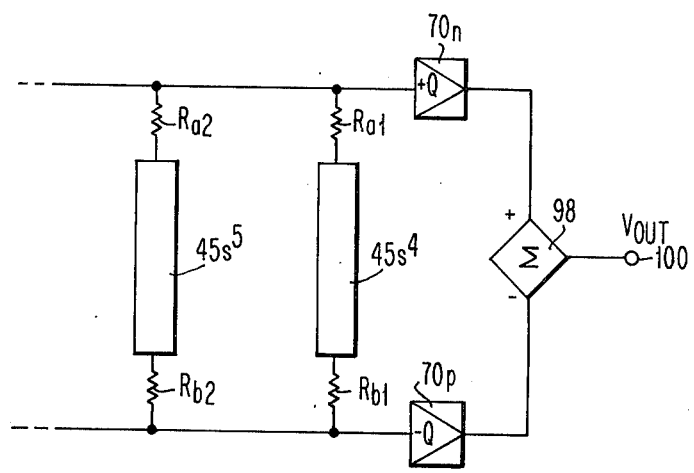

FIG. 7 illustrates an embodiment, based on a variation of the above method, which overcomes the resistance ratio problem and also derives both positive and negative weighting coefficients by using two charge detectors $70_p$ and $70_n$. The output from the positive detector $+70_p$ is subtracted from the output of the negative detector $-70_n$ and the final output voltage $V_{out}$ is equal to the algebraic sum (difference) of the two. In this case, both the magnitude and sign of the weighting coefficient are uniquely determined by the conductance network for each sense plate $45_s$. The weighting factor $h_i$ and the $i^{th}$ sense plate can be expressed as $$h_{(i)} = (R_{b(i)} - R_{a(i)})/(R_{b(i)} + R_{a(i)}). \qquad (9)$$

Since the weighting coefficients are primarily determined by the difference of the values of the two resistances elements, a large dynamic range is possible without large resistance ratios. Many methods are available for producing the conductance channels such as diffusion, deposition, and ion implementation. Laser and other trimming techniques may be employed to produce very accurate weighting coefficients with achievable accuracy to the order of 0.02%.

This method of weighting is not as sensitive to the sense plate area variations as is the split electrode weighting technique, and it does not require multiple MOSFET devices with matched characteristics such as those used in the floating diffusion and the floating gate sensing techniques.

Figure 8:
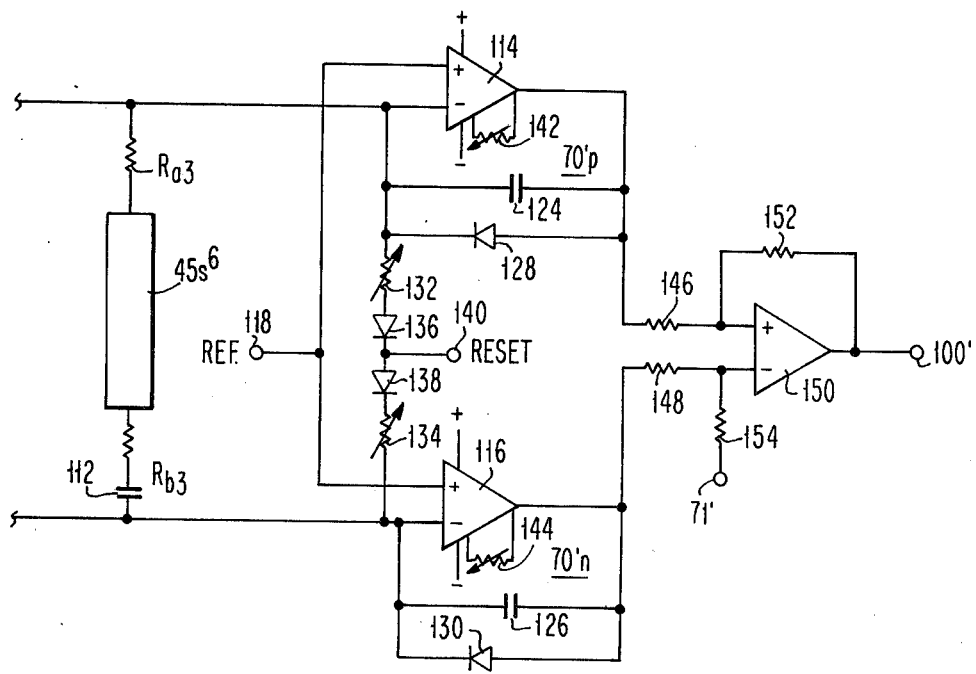

A more detailed schematic diagram illustrating practical circuitry embodying split conductance weighting in accordance with the invention is given in FIG. 8. Weighting resistance elements $R_{a3}$ and $R_{b3}$ connect the plate electrode $45s^6$ to a positive detecting circuit $70'_p$ and a negative detecting circuit $70'_n$ respectively. A capacitive element 112 is interposed in the series circuit for preventing direct current from flowing between the signal charge detecting circuits $70'_p$ and $70'_n$ due to offset voltages present between the two circuits. The detecting circuits comprise differential amplifier or repeating circuits 114 and 116 having one of the input terminals of each connected in common to a reference voltage input terminal 118. The repeating circuits 114 and 116 have charge integrating capacitors 124 and 126 connected from the output leads to the input leads to which the weighting resistance elements are connected. The latter capacitors are periodically reset by means of diodes 128,130 biased to a predetermined conductive state through adjustable resistors 132,134 and isolating diodes 136,138 connected in common to a negative going reset pulse at a terminal 140. The resistors 132 and/or 134 are adjustable for equalizing the reset state of the detecting circuits. Most operational amplifiers have provisions for offset voltage correction. An adjustable resistor 142 in the circuit of operational amplifier 114 and/or a similar resistor 144 in the circuit of the operational amplifier 116 is one example of conventional offset voltage adjusting circuitry. The output of the positive and negative detecting circuits $70'_p$ and $70'_n$ are applied to a mixing circuit comprising resistors 146,148 and a differential amplifier circuit 150 to one input terminal of which a feedback resistor 152 is connected. The other input terminal of the summing amplifier circuit 150 is connected to a point of reference potential by another resistor 154 and the output lead is connected to an output terminal 100'.

Figure 9:
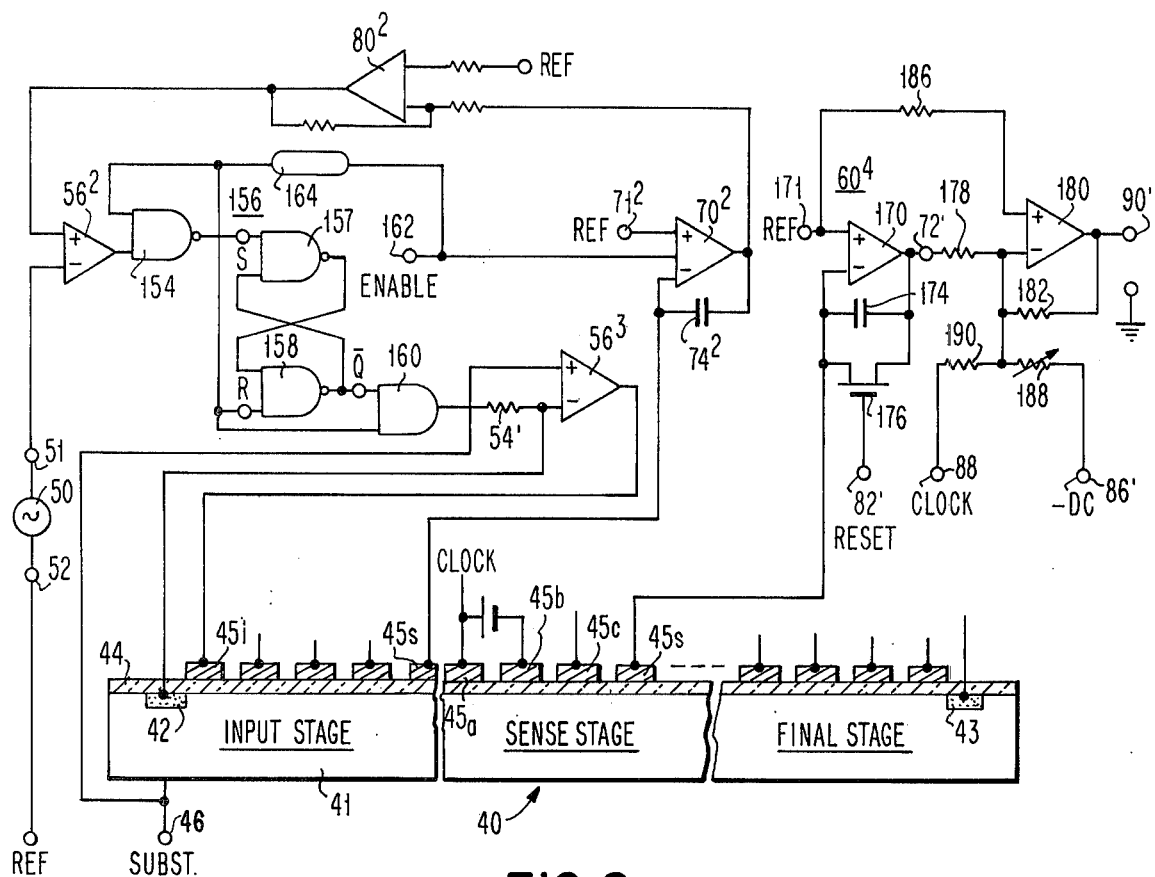
FIG. 9 is a schematic diagram of alternate charge launching and sensing subcircuitry according to the invention.

FIG. 9 is a schematic diagram of alternate charge launching and charge sensing subcircuitry according to the invention embodying some practical circuit variations as well. The charge launching subcircuitry is similar to that shown previously and in this respect, like reference numerals are used. The diode element 42 of the CCD 40 to the substrate is connected to one input terminal of an analog amplifier or repeater $56^3$ having another input terminal connected to a point of potential, usually the substrate potential as shown and having an output terminal connected to the input gating electrode $45i$. An input resistor $54'$ completes linear current launching subcircuitry. The current for this subcircuitry is provided by measured charge launching subcircuitry. A comparator $56^2$ in the form of a differential repeating or amplifying circuit has one input terminal connected to the signal input terminal 51 and has an output terminal connected to a NAND gating circuit 154. The output terminal of this circuit is connected to an S-R type flip-flop circuit 156 comprising two cross-connected NAND gating circuits 157 and 158. The complementary $\overline{Q}$ output terminal of the flip-flop circuit 156 is connected to an AND logical gating circuit 160 having an output terminal connected by way of the resistor $54'$ to the repeating circuit $56^3$. The other input terminal of the comparator circuit $56^2$ is connected to a charge detecting circuit $70^3$ at the output of another analog amplifier or repeater circuit $80^2$. One input terminal of this amplifier circuit $70^2$ is connected to an integrating capacitor $74^2$, which is also connected to the output terminal of the circuit $70^2$, and to the sense plate electrode 45S of the input stage of the CCD 40. The other input terminal of the comparator circuit $70^2$ is connected to a point of fixed reference potential applied at a terminal $71^2$ as in the previously described embodiments of the invention. The amplifier circuit $70^2$ preferably is biased to quiesence until an electric enabling level is applied to an enabling terminal 162. The gating circuits 154,158 and 160 are also enabled by the same electric enabling level but preferable at a slightly later time for which feature a time delay element 164 is interposed in the circuit as shown.

Figure 10:
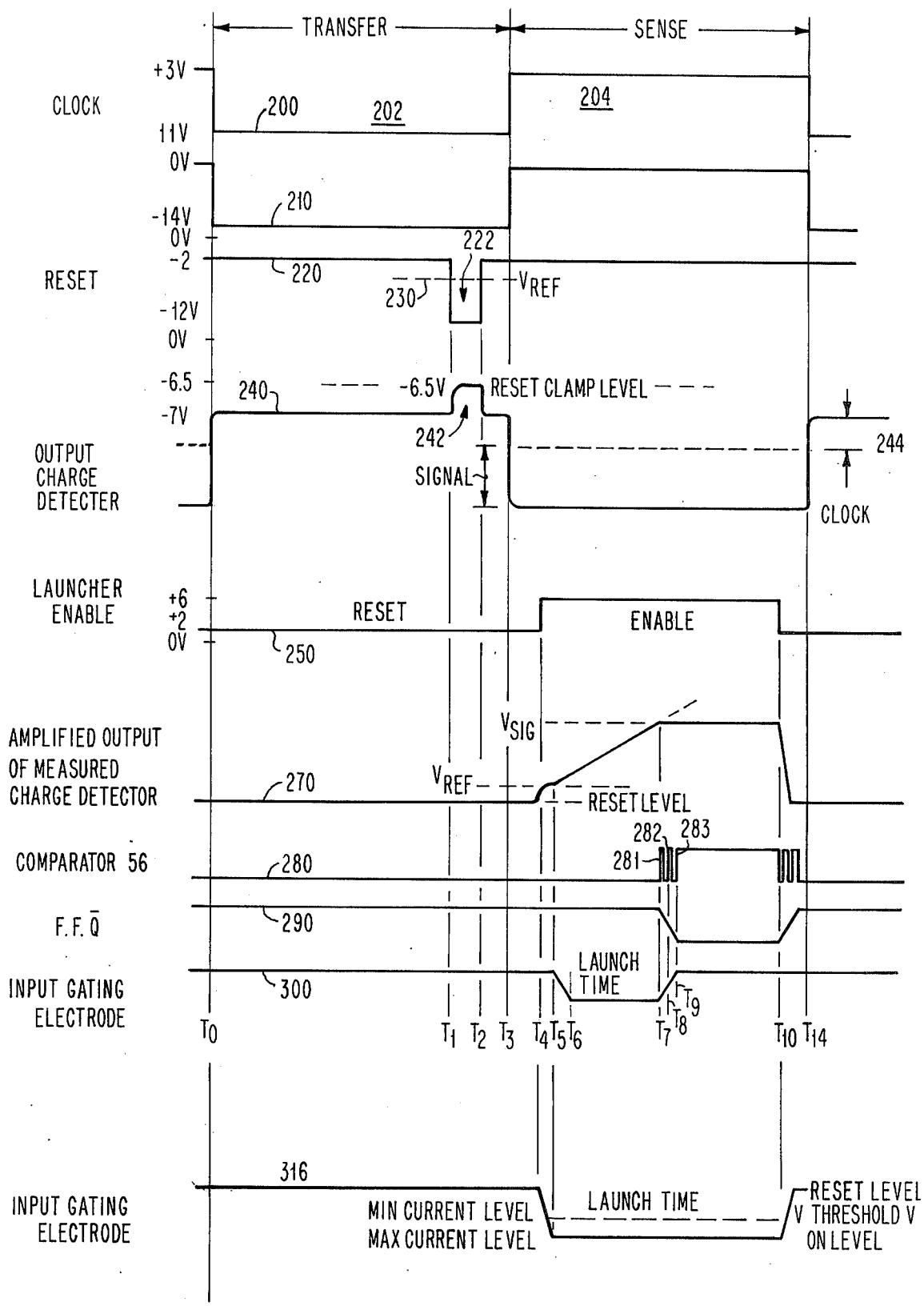
FIG. 10 is a graphical representation of electric waveforms useful in an understanding of circuitry according to the invention.

The operation of this charge launching subcircuitry is better understood with reference to the graphical representations of waveforms set forth in FIG. 10.

A graphical representation of the clock pulse applied to the plate electrode $45a_1$ is shown by a curve 200. The curve 200 and all of the other curves in this graphical representation are idealized for a clearer understanding of the intended operation of the circuitry according to the invention. It should be clearly understood that those skilled in the art will apply the teachings of the invention to the many forms of CCD available with fully acceptable resultant waveforms that will depart considerably from the ideal. Two consecutive half-cycles 202 and 204 are shown of a 50—50% duty cycle. Those skilled in the art will adapt other duty cycle ratios as required by the problem at hand. A signal charge is launched, time $t_6$–$t_7$ into the CCD during half-cycle 204, time $t_3$–$t_{14}$. Signal charge is transferred during half-cycle 202, time $t_0$–$t_3$ and sensed during half-cycle 204, time $t_3$–$t_{14}$. Output sensing must commence before time $t_3$ and continue until charge is transferred in the sense stage except for sensing in the first, or launching stage, where it may occur before but preferably not until after stabilization at time $t_3$. Actual charges are transferred at transition times $t_0$, $t_3$ and $t_{14}$; charge is stable during the intervals between these transitions. A curve 210 shows a voltage wave as applied to a plate electrode $45b_1$ of the CCD. Note that this curve has the same time-phase relationship as the clock pulse wave 200, but is offset (in a negative direction here) by the bias voltage on the particular plate electrode. Here direct bias voltage is applied to the succeeding electrode $45b_1$ as required. The reset pulse train is graphically represented by a curve 220 from which it is noted that the reset pulse 222 preferably occurs, time $t_1$–$t_2$, substantially prior to transition time $t_3$. The fixed reference voltage level is represented by a dashed line 230 through the reset pulse 222. A graphical representation of the wave at the output of the amplifier $80^2$ is represented by a curve 240. The reset pulse 222 is applied for clamping the charge detector to approximately $-6.5$ volts as represented by a pulse 242. A level change due to clock pulse feedthrough occurs at $t_3$ time, and is represented in the form of an offset voltage 244. An enabling voltage wave is represented by a curve 250. This voltage wave is applied at enabling voltage input terminal 162. The output from the sensing circuit amplifier $70^2$ is represented by a curve 270. Another curve 280 represents the output voltage of the comparator circuit $56^2$. Note the spike pulses 281 at time $t_7$ and 282 at time $t_8$ This is a typical example of the response of comparator circuits when a slow ramp input wave is applied. The flip-flop circuit 156 is arranged to trigger on the first rising impulse 281, whereby the succeeding voids between pulses are obviated and the output wave at the complementary Q output terminal is represented by a curve 290. For ready reference, a following curve 300 represents the voltage wave at the input gating plate electrode $45i$. The time period $t_4$–$t_5$ is the delay brought about by the delay line 164 so that the sensing circuit $70^2$ has time to settle after being enabled and before the flip-flop 156 and associated gates are effective as shown by the curves 250, 270 and 300. For comparison, the voltage on the input gate electrode $45i$ is represented by a curve 316. This waveform relates to the linear current method illustrated in FIG. 4.

Curves representing the charge location and/or transfer relationships are better shown in the next illustration showing surface potential distribution at the interface.

Figure 11:
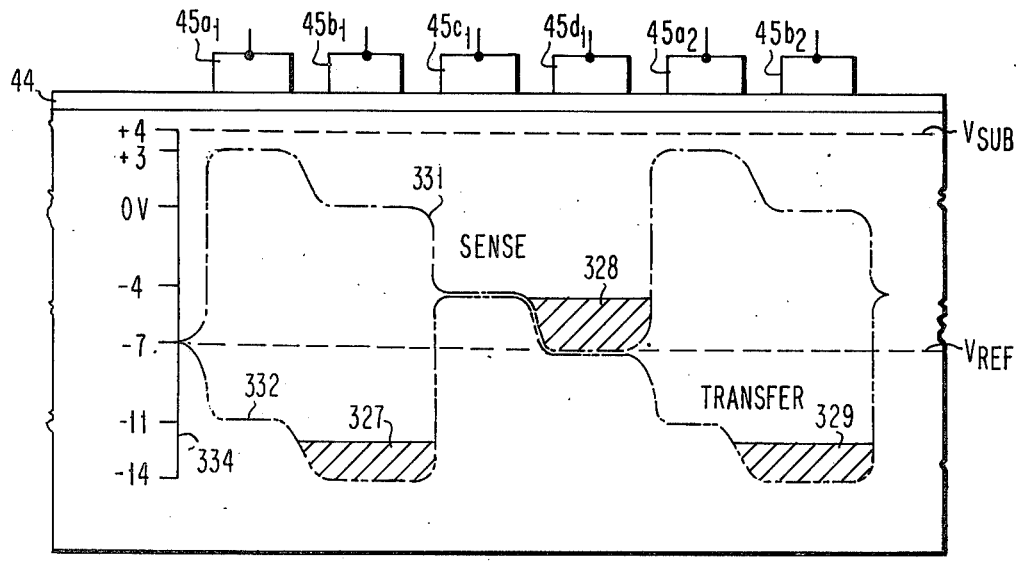
FIG. 11 is another graphical representation of the operation of circuitry according to the invention.

FIG. 11 is a schematic diagram along lines which are conventional practice in discussing CCD operation. One stage of a CCD is represented by a block 321 corresponding to a semi-conductor substrate forming the storage medium, an overlying insulating layer 44 and, corresponding plate electrodes $45a_1$, $45b_1$, $45c$, $45s$, $45a_2$ and $45b_2$. The storage "wells" beneath the electrodes are represented by lines 331 and 332 against a representative voltage scale 334 for a method of operation termed a "single phase mode", which is but one example of a number of different modes known to those skilled in the art. The electrodes $45a_1$ and $45a_2$ have a wave applied thereto as represented by the curve 200 (FIG. 10), the electrodes $45b_1$ and $45b_2$ are subjected to a wave as represented by the curve 210, the electrode $45c$ a direct potential of $-4$ volts, the electrode $45s$ being $-3$ volts lower. The charges after each shift being represented "at the bottom of the wells" as is customary in the art by the hachured areas 327, 328 and 329 schematically depicting "charges in the wells".

Curves representing the charge location and/or transfer relationships are better shown in the next illustration.

Returning to FIG. 9, alternate charge sensing circuitry $60^4$ comprises an operating differential operational amplifying circuit 170. An integrating capacitor 174 is shunted from output to input as in the previous embodiments. As shown here, the capacitor 174 is reset by means of another type of semiconductor device in the form of an FET 176 shunted across the capacitor for reducing the charge to zero on the application of the reset pulse wave at the terminal 82'. The output terminal 72' of the charge sensing circuit $60^4$ is applied through a resistor 178 to a mixer circuit comprising a level shifting differential amplifying circuit 180 having a feedback resistor 182 connected between the output terminal 90' and the signal input terminal. A similar series resistor 186 connects the other input terminal of the differential amplifying circuit 180 to the source of reference potential at the terminal 171. The accumulated effects of offset voltage are obviated by dc potential obtained from the terminal 86' and applied through an adjustable resistance element 188 to the input circuit of the differential amplifying circuit 180. Similarly, clock pulses appearing at terminals 88' are applied through a variable resistor 190 for nullifying the effect of clock feedthrough which enters the circuit through the CCD 40.

While the invention has been described in terms of preferred embodiments, and variations thereof have been shown and described, it is clearly to be understood that those skilled in the art will apply the teachings of the invnetion in still other embodiments without departing from the spirit and scope of the invention as defined in the appended claims.

The invention claimed is:

1. Operating circuitry for a semiconductor charge coupled device of the type comprising
    a charge storage medium,
    an insulating layer covering the charge storage medium,
    a multiple of discrete charge storage sites within said charge storage medium,
    each site formed by an associated field plate electrode disposed on said insulating layer,
    each said plate being contiguous to two other such plate electrodes save the first and the last said plate electrodes,
    a charge launching site contiguous to said first plate electrode, and
    a charge delivering site contiguous to said last plate electrode,
    each of said charge launching and said charge delivering sites having a junction diode element in said charge storage medium, and
    circuitry for applying appropriate electric potential to at least two of said transfer plate electrodes for controllably propagating electric charge between selected charge storage sites and ultimately to said charge delivering site,
    said operating circuitry comprising
    subcircuitry connected to said first plate electrode for launching a signal charge in said charge coupled device, and
    subcircuitry connected to one of said plate electrodes other than said first plate electrode for sensing a signal charge propagated in said charge coupled device, and said launching subcircuitry comprising
a signal input terminal electrically connected to said substrate,
another signal input terminal at which an electric signal to be propagated is applied with respect to said input terminal connected to said substrate,
a differential repeating circuit having one input terminal electrically connected to said substrate, another input terminal connected to said charge launching site diode element and an output terminal connected to the input gating plate electrode adjacent said charge launching site diode element, and
a resistance element electrically connected between said other signal input terminal and said other input terminal of said repeating circuit,
said resistance element having a value at which the rate of charge launched is the linear integral with respect to time of the value of the input signal voltage divided by the value of the resistance element.

2. Operating circuitry for semiconductor charge coupled devices as defined in claim 1 and incorporating
a diode element connected between said one input terminal of said repeating circuit and the output terminal thereof,
another diode element and another resistance element connected in series between said one input terminal of said repeating circuit and a sampling wave terminal for automatically sampling the signal applied across said signal input terminals.

3. Operating circuitry for a semiconductor charge coupled device of the type comprising
a charge storage medium,
an insulating layer covering the charge storage medium, a multiple of discrete charge storage sites within said charge storage medium,
each site formed by an associated field plate electrode disposed on said insulating layer,
each said plate electrode being contiguous to two other such plate electrodes save the first and the last said plate electrodes,
a charge launching site contiguous to said first plate electrode, and
said site field plate electrodes including at least two series of at least two transfer plate electrodes and a sense plate electrode following said first plate electrode, and
a charge delivering site contiguous to said last plate electrode,
each of said charge launching and said charge delivering sites having a junction diode element in said charge storage medium, and
circuitry for applying appropriate electric potential to at least two of said transfer plate electrodes for controllably propagating electric charge between selected charge storage sites and ultimately to said charge delivering site, and
launching subcircuitry comprising
a pair of signal input terminals between which an electric signal to be propagated is applied,
one differential repeating circuit having one input terminal electrically connected to one of said signal input terminals, another input terminal and an output terminal at which different electric levels are delivered between transitions established in response to said appropriate electric potential,
a charge detecting circuit connected between said other input terminal of said one repeating circuit and the first sense plate electrode subsequent to said input gating plate electrode,
another differential repeating circuit having one input terminal connected to a point of fixed reference potential, another input terminal and an output terminal connected to an input gating plate electrode adjacent to said charge launching site diode element,
circuitry connected to said one differential repeating circuit and responsive to the first electric signal transition therefrom for changing the electric level at the output terminal of said one differential repeating circuit to a different electric level,
and a resistance element connecting said output terminal of said level changing circuitry to said other input terminal of said other differential repeating circuit.

4. Operating circuitry for semiconductor charge coupled devices as defined in claim 3 and wherein said level changing circuitry comprises a bistable, bilateral flip-flop circuit.

5. Operating circuitry for semiconductor charge coupled devices as defined in claim 3 and wherein
said level changing circuitry comprises
a NAND gating circuit having one input terminal connected to the output terminal of said one repeating circuit,
another input terminal, and an output terminal,
a flip-flop circuit having a set terminal connected to the output terminal of said NAND gating circuit, another input terminal, and a pair of complementary output terminals,
an AND gating circuit having an input terminal connected to one of said complementary output terminals of said flip-flop circuit another input terminal, and an output terminal,
a resistance element interconnecting said output terminal of said AND gating circuit to said other input terminal of said other repeating circuit, and
circuitry for applying an enabling voltage to said other input terminals of said NAND and said AND gating circuits and said flip-flop circuit.

6. Operating circuitry for semiconductor charge coupled devices as defined in claim 5 and wherein
said charge detecting circuit comprises
a differential repeating circuit having one input terminal connected to said first sense plate electrode, another input terminal connected to a point of fixed reference potential, an output terminal connected to said other input terminal of said one repeating circuit and an enabling terminal at which said enabling wave is applied.

7. Operating circuitry for semiconductor charge coupled devices as defined in claim 6 and incorporating
a time delay circuit interposed in said enabling circuitry after said charge detecting circuitry,
whereby said level charging circuitry is enabled after said charge detecting circuitry.

8. Operating circuitry for semiconductor charge coupled devices as defined in claim 6 and wherein
said flip-flop circuit comprises two cross-connected NAND gating circuits.

9. Operating circuitry for semiconductor charge coupled devices as defined in claim 3 and incorporating
another charge detecting circuit substantially identical to said charge detecting circuit having an input terminal connected to one of said sense plate electrodes subsequent to the said first sense plate electrode and having an output terminal at which an output voltage is delivered, whereby any non-linear effect of the depletion region capacitance of the charge coupled device is substantially compensated.

10. Operating circuitry for semiconductor charge coupled devices as defined in claim 9, and wherein said other charge detecting circuit comprises an additional differential amplifier circuit having one input terminal connected to said one sense plate electrode, another input terminal connected to a point of fixed reference potential and an output terminal at which said output voltage is delivered, and incorporating a further differential repeating circuit having one input terminal connected to a point of fixed reference potential, having another input terminal connected to the output terminal of said additional differential repeating circuit, and an output terminal, a resistance element connected between the output terminal and said other input terminal of said further repeating circuit, and a resistance element connected between said other input terminal of said further repeating circuit and a source of clock signal appearing in said charge coupled device.

11. Operating circuitry for semiconductor charge coupled devices as defined in claim 10 and incorporating an adjustable resistance element connected between said other input terminal of said further repeating circuit and a source of dc potential for applying compensating offset potential to said subcircuitry.

12. Operating circuitry for a semiconductor charge coupled device of the type comprising a charge storage medium an insulating layer covering the charge storage medium, a multiple of discrete charge storage sites within said charge storage medium, each site formed by an associated field plate electrode disposed on said insulating layer, each said plate electrode being contiguous to two other such plate electrodes save the first and the last said plate electrodes, a charge launching site contiguous to said first plate electrode, a charge delivering site contiguous to said last plate electrode, each of said charge launching and said charge delivering sites having a junction diode element in said charge storage medium, and circuitry for applying appropriate electric potential to at least two of said transfer plate electrodes for controllably propagating electric charge between selected charge storage sites and ultimately to said charge delivering site, and launching subcircuitry comprising a pair of signal input terminals between which an electric signal to be propagated is applied, a differential repeating circuit having one input terminal, another input terminal and an output terminal, a resistor connected between one of said signal input terminals and said one repeating circuit input terminal and to said junction diode element adjacent said launching site, an electric connection between said other of repeating circuit input terminals and the other of said signal input terminals and said charge storage medium, another electric connection between said output terminal and said one input terminal of said differential repeating circuit, and a further electric connection between said output terminal of said differential repeating circuit and said first plate electrode.

13. Operating circuitry for a semiconductor charge coupled device as defined in claim 12 and incorporating a diode element interposed in said other electric connection.

14. Operating circuitry for a semiconductor charge coupled device as defined in claim 12 and incorporating an enabling signal input terminal, and a diode and a resistor in series between said enabling signal input terminal and said one input terminal of said repeating circuit.

15. Operating circuitry for a semiconductor charge coupled device of the type comprising a charge storage medium, an insulating layer covering said charge storage medium, a multiple of discrete charge storage sites within said charge storage medium, each said plate electrode being contiguous to two other electrodes, a charge launching site contiguous to said first plate electrode, at least two transfer plate electrodes and a sense plate electrode following said first plate electrode, and a charge delivering site contiguous to said last plate electrode, each of said charge launching and said charge delivering sites having a junction diode element in said charge storage medium, and circuitry for applying appropriate electric potential to at least two of said transfer plate electrodes for controllably propagating electric charge between selected charge storage sites and ultimately to said charge delivering site, and weighting sensing subcircuitry comprising a positive charge detecting circuit comprising a differential repeating circuit having one input terminal, another input terminal connected to a source of reference potential and an output terminal, and a capacitor connected from said output terminal to said one input terminal, a diode element connected across said capacitor, and another diode element and a resistive element connected in series between a source of reset potential and said one input terminal of said repeating circuit, a negative charge detecting circuit comprising a differential repeating circuit having one input terminal, another input terminal connected to said source of reference potential and an output terminal, and a capacitor connected from said output terminal to said one input terminal, a diode element connected across said capacitor, and another diode element and a resistive element connected in series between said source of reset potential and said one input terminal of said repeating circuit, an electric algebraic summing circuit havine one input terminal connected to the output terminal of said positive charge detecting differential repeating circuit, another input terminal connected to the output terminal of said negative charge detecting differential repeating circuit and an output terminal at which an output voltage is presented, one resistance element interconnecting one sense plate electrode to said one input terminal of said positive charge detecting differential repeating circuit, and another resistance element interconnecting said one sense plate electrode to said one input terminal of said negative charge detecting differential repeating circuit, said output voltage being proportional to a weighting factor equal to the quotient of the difference in values of said resistance elements divided by the sum thereof.

16. Operating circuitry for semiconductor charge coupled devices as defined in claim 15 and wherein a capacitor is interposed in the connection between said one sense plate electrode and the input terminal of one of said detecting differential repeating circuits, and said summing circuit comprises a differential repeater circuit having two input terminals and having an output terminal, and a pair of resistance elements individually connected between said input terminals and said detecting differential repeating circuits.

* * * * *